United States Patent
Ohtani et al.

(10) Patent No.: US 9,653,853 B2
(45) Date of Patent: May 16, 2017

(54) ELECTRICAL CONNECTION BOX INCLUDING A CIRCUIT SUBSTRATE

(71) Applicant: Anden Co., Ltd., Anjo, Aichi-Pref. (JP)

(72) Inventors: Hideyuki Ohtani, Nisshin (JP); Naoyuki Yasuda, Okazaki (JP)

(73) Assignee: Anden Co., Ltd., Anjo, Aichi-pref (JP)

( * ) Notice: Subject to any disclaimer, the term of this patent is extended or adjusted under 35 U.S.C. 154(b) by 0 days.

(21) Appl. No.: 15/057,502

(22) Filed: Mar. 1, 2016

(65) Prior Publication Data

US 2016/0261077 A1 Sep. 8, 2016

(30) Foreign Application Priority Data

Mar. 5, 2015 (JP) ................................. 2015-043839

(51) Int. Cl.
| | |
|---|---|
| *H01R 13/66* | (2006.01) |
| *H01R 12/70* | (2011.01) |
| *H01R 13/405* | (2006.01) |
| *H01R 13/516* | (2006.01) |
| *H01R 12/72* | (2011.01) |
| *H05K 1/18* | (2006.01) |

(52) U.S. Cl.
CPC ....... *H01R 13/665* (2013.01); *H01R 12/7052* (2013.01); *H01R 13/405* (2013.01); *H01R 13/516* (2013.01); *H01R 12/722* (2013.01); *H01R 12/724* (2013.01); *H01R 13/6658* (2013.01); *H05K 1/181* (2013.01)

(58) Field of Classification Search
CPC ..... H05K 1/181; H01R 12/724; H01R 12/722
USPC .................................................. 439/79, 76.1
See application file for complete search history.

(56) References Cited

U.S. PATENT DOCUMENTS

| | | | | |
|---|---|---|---|---|
| 6,434,013 B2 * | 8/2002 | Kitamura | ............. | H05K 5/0039 174/50 |
| 7,080,990 B1 * | 7/2006 | Juntwait | ............. | H01R 12/724 439/76.1 |
| 7,094,075 B1 * | 8/2006 | Lim | ................... | H01R 12/7005 439/76.1 |

FOREIGN PATENT DOCUMENTS

| | | |
|---|---|---|
| JP | 2007-073321 A | 3/2007 |
| JP | 2012-235578 A | 11/2012 |
| JP | 2014-110224 A | 6/2014 |
| JP | 2014-217104 A | 11/2014 |

* cited by examiner

*Primary Examiner* — Abdullah Riyami
*Assistant Examiner* — Justin Kratt
(74) *Attorney, Agent, or Firm* — Harness, Dickey & Pierce, P.L.C.

(57) ABSTRACT

An electric connection box includes a resin plate having a connector terminal soldered to a via hole of a circuit substrate. The circuit substrate and the resin plate are inserted to be housed in an opening part of a casing of the electric connection box. A housing is positioned in the opening part and functioning as a cover closing an opening side of the casing. The circuit substrate is supported by the housing and the casing through the resin plate that is held between the housing and the casing while the circuit substrate is spaced from the housing and the casing.

10 Claims, 9 Drawing Sheets

ELECTRICAL CONNECTION BOX INCLUDING A CIRCUIT SUBSTRATE

CROSS REFERENCE TO RELATED APPLICATION

This application is based on and incorporates herein by reference Japanese Patent Application No. 2015-043839 filed on Mar. 5, 2015.

TECHNICAL FIELD

The present disclosure relates to an electric connection box including a circuit substrate electrically connected to an external part through a connector portion while the circuit substrate is covered hermetically.

BACKGROUND

Conventionally, when an ECU (electronic control unit) including a circuit substrate such as a printed substrate is manufactured, a connector portion including a connector terminal is prepared first. The connector terminal is formed in the connector portion by press-fitting or insert-molding to be used for external connection. The connector terminal is attached to the circuit substrate. The connector portion as a cover (lid) of a casing is inserted into an opening part of the casing to seal the casing while the circuit substrate is housed in the casing. An electric connection box including the ECU having such configuration is known. For example, Patent Document 1 (JP 2012-235578), Patent Document 2 (JP 2007-073321) and Patent Document 3 (JP 2014-217104) show such electric connection boxes.

In Patent Document 1, a connector portion and a circuit substrate are fixed to each other by screwing. As compared to a case where a connector portion and a circuit substrate are connected each other only through a soldered part, a stress acted on the soldered part can be reduced. However, in this case, the screwing is necessary. Therefore, the number of components such as a screw is increased, and the number of manufacturing steps such as a screwing step is also increased.

In Patent Documents 2 and 3, a connector terminal is in contact with and supported by a casing. Hence, a stress acted on a soldered part between the connector terminal and a circuit substrate can be reduced without screwing. However, in this case, an assembly of the connector terminal to the circuit substrate is performed after electronic components are attached to the circuit substrate in a reflow process. Hence, soldering to electrically connect the connector terminal and the circuit substrate is performed in a flow process after the reflow process. As a result, soldering is performed twice (i.e. the reflow process and the flow process are performed).

Patent Document 4 (JP 2014-110224) has proposed a structure in which soldering of electronic components or a connector terminal to a circuit substrate can be performed by a single reflow process.

When soldering of the electronic components to the circuit substrate and soldering of the connector terminal to the electronic components are performed simultaneously in the reflow process, the circuit substrate is transferred to a reflow step in a state where the connecter terminal of a connector portion is inserted into a through-hole of the circuit substrate. The connector portion functioning as the cover (lid) of the casing, shown by Patent Document 1 to 3, has a size to close the opening part of the casing, i.e. larger than the circuit substrate in a direction along the circuit substrate. Hence, the circuit substrate is transferred in a state where the connector portion extends outward of the circuit substrate in the direction along the circuit substrate. Therefore, in order to protect the circuit substrate and the connector portion during the transferring and to secure a space for the transferring, it is necessary to provide a transfer space, so-called "ear", surrounding the circuit substrate and the connector portion.

Figure 10:
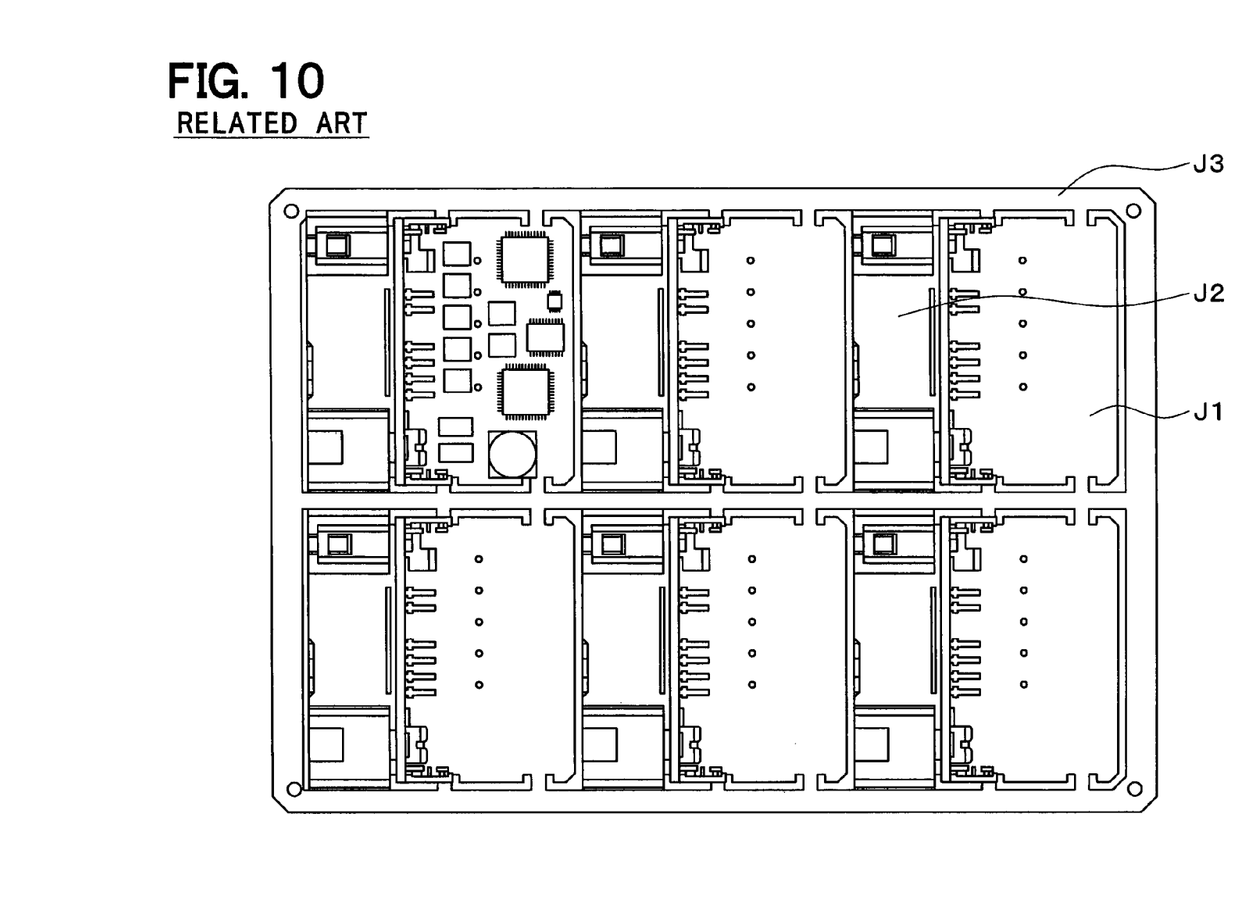
FIG. 10 is a view showing a multiple-set substrate having multiple circuit substrates, according to a related art.

For example, FIG. 10 is a diagram showing a multiple-set substrate including multiple circuit substrates J1. A connector portion J2 is attached to each circuit substrate J1, and a transfer space J3 is provided to surround all of the circuit substrates J1 and the connector portions J2. In this case, the electronic components and the connecter terminal can be soldered to the circuit substrate in the reflow process at a time. However, the transfer space may be necessary, and a size of a substrate, such as the multiple-set substrate, may be required to be enlarged. Thus, the number of circuit substrates per unit area may decrease, and a manufacturing cost may increase. Further, the connector portion is subjected to high temperature in the reflow process, and the connector portion may need to be made of heat-resistant resin. Thus, a degree of freedom of material selection may reduce, and a cost of the connector portion may increase.

When the structure of the electric connection box without screwing as in Patent Documents 2 and 3 and the reflow process as in Patent Document 4 where the electronic components and the connector terminal are soldered to the circuit substrate simultaneously are combined, effects due to omission of a screwing step may be obtained, but a cost reduction effect may not be obtained or a cost may increase.

SUMMARY

It is an objective of the present disclosure to provide an electric connection box capable of reducing a stress acted on a soldered part between a connector terminal and a circuit substrate.

According to an aspect of the present disclosure, an electric connection box includes a circuit substrate, a resin plate, a casing and a housing. The circuit substrate includes a wiring and a via hole connected to the wiring. The resin plate includes a connector terminal soldered to the via hole, and the resin plate is integrated with the circuit substrate. The casing includes an opening part having an opening side through which the circuit substrate and the resin plate are inserted to be housed in the opening part. The housing is positioned in the opening part and functions as a cover closing the opening side of the casing. The resin plate is interposed between and held by the housing and the casing. The circuit substrate is supported by the housing and the casing through the resin plate held between the housing and the casing while the circuit substrate is spaced from the housing and the casing.

Accordingly, even when a stress acts on the connector terminal, a stress acting on a soldered part between the connector terminal and the circuit substrate can be reduced. The resin plate can be separated from the housing. Thus, at least only the resin plate and the circuit substrate need to be soldered in the reflow process, and the housing is not need to be subjected to high temperature.

Therefore, the stress acting on the soldered parts between the connector terminal and the circuit substrate can be reduced, even without exposure of the housing to high temperature or screwing of the circuit substrate to the housing.

BRIEF DESCRIPTION OF THE DRAWINGS

The disclosure, together with additional objectives, features and advantages thereof, will be best understood from the following description, the appended claims and the accompanying drawings, in which:

DETAILED DESCRIPTION

An embodiment of the present disclosure will be described with reference to FIGS. 1 to 9. In the present embodiment, a relay module device 1 will be described as an example of an electric connection box.

Figure 1:
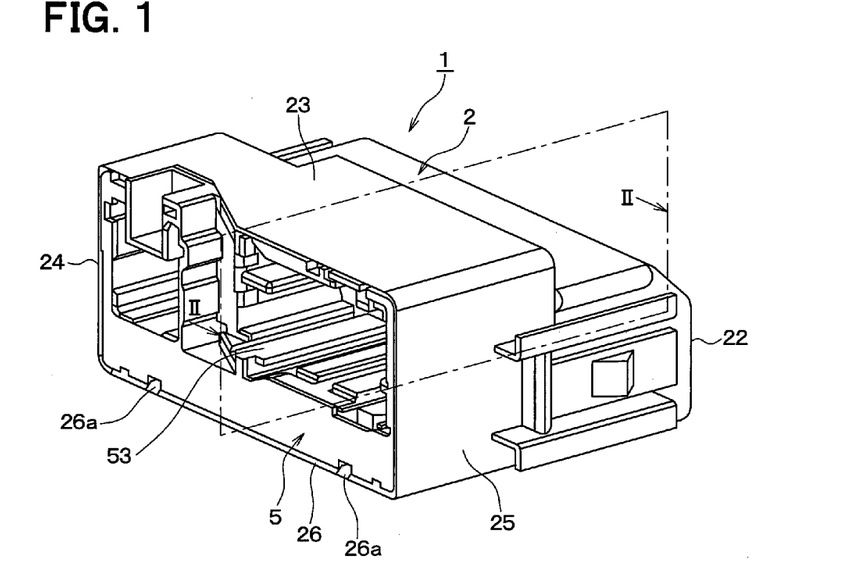
FIG. 1 is a perspective view showing a relay module device according to an embodiment of the present disclosure.
Figure 2:
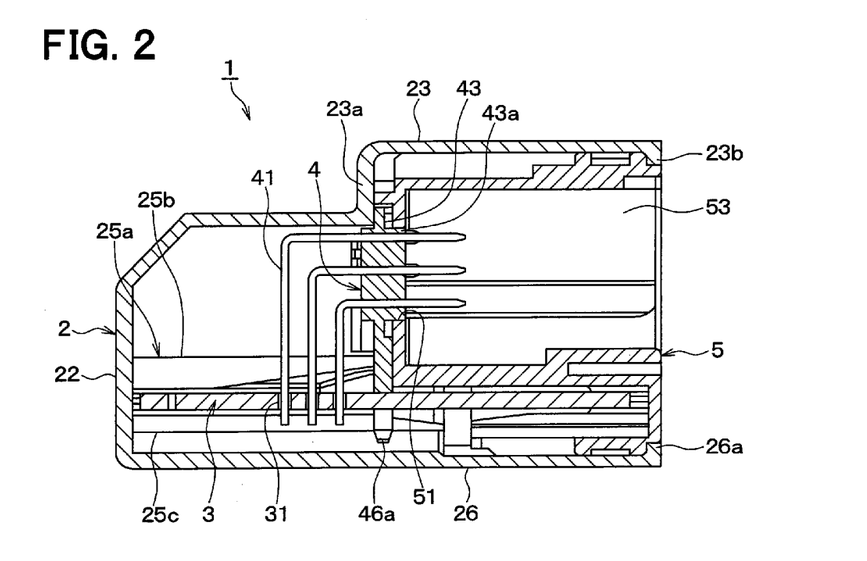
FIG. 2 is a sectional view taken along a plane II of FIG. 1.
Figure 3:
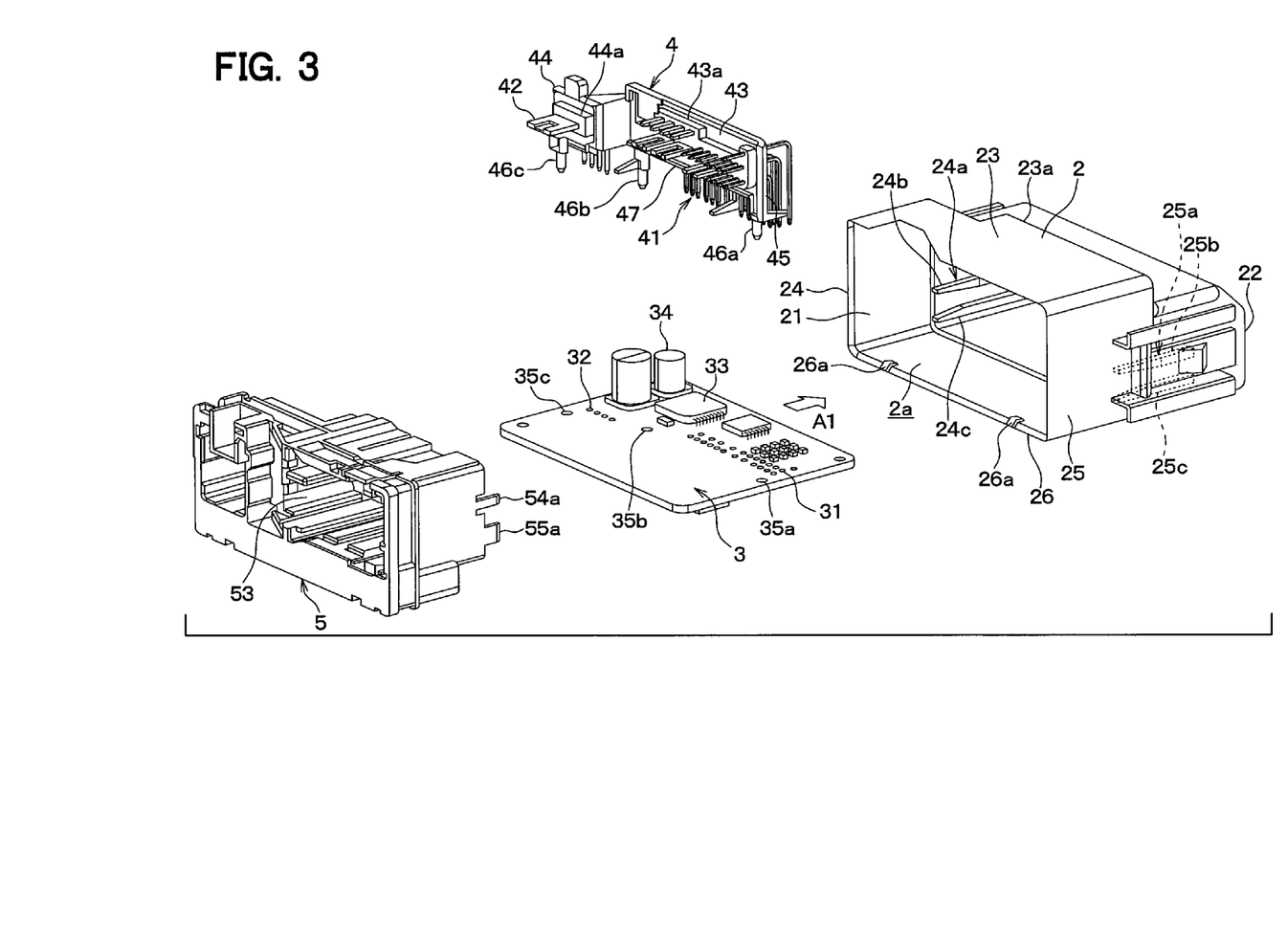
FIG. 3 is an exploded perspective view showing the relay module device according to the embodiment.

The relay module device 1 is a device provided with a relay circuit that is used for driving a load. As shown in FIGS. 1 to 3, the relay module device 1 includes a casing 2, a circuit substrate 3, a resin plate 4 and a housing 5. The casing 2 has an opening part 2a that is open on a side of the casing 2. The housing 5 is fitted to the opening part 2a of the casing 2 while the circuit substrate 3 and the resin plate 4 are inserted into the opening part 2a of the casing 2. As shown in FIG. 2, the circuit substrate 3 and the resin plate 4 are housed in the casing 2, and the resin plate 4 attached to the circuit substrate 3 is held between the casing 2 and the housing 5 within the casing 2. Accordingly, the circuit substrate 3 and the resin plate 4 are held in the casing 2. The resin plate 4 may be in direct contact with both the casing 2 and the housing 5 therebetween.

As shown in FIG. 3, a side of the casing 2 has an opening and is referred to as an opening side 21. A side wall of the casing 2 opposite from the opening side 21 is referred to as a bottom side wall 22. Four side walls of the casing 2 extending from the bottom side wall 22 to the opening side 21 are referred to as lateral side walls 23, 24, 25 and 26. Each of the lateral side walls 23, 24, 25 and 26 has an approximately rectangular shape. The housing 5 is fitted to the opening side 21 of the casing 2, thereby sealing the casing 2.

One of the lateral side walls 23, 24, 25 and 26 of the casing 2, which faces inward to a side of the circuit substrate 3 on which the resin plate 4 is disposed, is referred to as a stepped side wall 23. The stepped side wall 23 has a step portion 23a having a stepped shape. Accordingly, the casing 2 has a structure in which an area of the bottom side wall 22 is smaller than an area of the opening side 21. Other two of the lateral side walls 23, 24, 25 and 26, which are positioned adjacent to the stepped side wall 23, are referred to as rail side walls 24 and 25 and include rail portions 24a and 25a which extend inward from inner wall surfaces of the rail side walls 24 and 25 to the opening part 2a. The circuit substrate 3 is guided along the rail portions 24a and 25a when the circuit substrate 3 is inserted into the casing 2. Another of the lateral side walls 23, 24, 25 and 26, which is opposite from the stepped side wall 23, is referred to as an installation side wall 26 along which the circuit substrate 3 is disposed.

As shown in FIG. 2, the step portion 23a formed on the stepped side wall 23 includes an inner wall surface perpendicular to the stepped side wall 23. The inner wall surface of the step portion 23a may be perpendicular to an insertion direction along which the circuit substrate 3 is inserted into the casing 2. The inner wall surface of the step portion 23a may be perpendicular to a surface of the circuit substrate 3. The inner wall surface of the step portion 23a is in contact with the resin plate 4. A position at which the step portion 23a is formed with respect to the bottom side wall 22, in other words, a distance from the bottom side wall 22 to the step portion 23a is longer than a length of an extension part of the circuit substrate 3 from the resin plate 4 toward the bottom side wall 22. As a result, an end surface of the circuit substrate 3 is spaced from an inner surface of the bottom side wall 22.

The stepped side wall 23 has a protrusion portion 23b located at an edge of an inner wall surface of the stepped side wall 23 adjacent to the opening side 21. When the housing 5 is fitted into the casing 2, the protrusion portion 23b is engaged with the housing 5 and prevents the housing 5 from dropping out of the casing 2.

The rail portion 24a formed on the rail side wall 24 includes a first rail 24b and a second rail 24c which are spaced from each other. The rail portion 25a formed on the rail side wall 25 includes a first rail 25b and a second rail 25c which are spaced from each other. The first rails 24b and 25b and the second rails 24c and 25c extend along the insertion direction (represented by an arrow A1 in FIG. 3) in which the circuit substrate 3 is inserted into the casing 2.

A distance between the first rail 24b and the second rail 24c and a distance between the first rail 25b and the second rail 25c are gradually decreased according to a position in the insertion direction from the opening side 21 toward the bottom side wall 22. These distances between the first rails 24b, 25b and the second rails 24c, 25c at ends adjacent to the bottom side wall 22 are slightly larger than a thickness of the circuit substrate 3. Hence, when the circuit substrate 3 is inserted into the casing 2, the circuit substrate 3 can be inserted easily to a relatively larger space between the first rail 24b, 25b and the second rail 24c, 25c. When the circuit substrate 3 is inserted and moves toward the bottom side wall 22 between the first rail 24b, 25b and the second rail 24c, 25c, a space between the circuit substrate 3 and at least one of the first rail 24b, 25b and the second rail 24c, 25c is gradually reduced. Accordingly, the circuit substrate 3 can be held at a desired position.

The lengths of the first rails 24b and 25b and the lengths of the second rails 24c and 25c in the insertion direction may be set arbitrarily. In the present embodiment, the lengths of the first rails 24b and 25b are set such that ends of the first rails 24b and 25b facing to the opening side 21 are in contact with the resin plate 4. Further, a degree of protruding of the first rails 24b and 25b and the second rails 24c and 25c from the inner wall surfaces of the rail side walls 24 and 25 may be set arbitrarily. However, the degree of protruding is set such that a distance between the rail portion 24a and the rail portion 25a is shorter than a width of the circuit substrate 3 in a direction perpendicular to the insertion direction of the circuit substrate 3 into the casing 2. Moreover, the degree of protruding is set such that the both rail portions 24a and 25a do not contact components mounted on the circuit substrate 3.

As shown in FIG. 2, the installation side wall 26 is separated by a predetermined distance from the circuit substrate 3 inserted into the casing 2. The distance between the installation side wall 26 and the circuit substrate 3 is set such that a protruding end part such as a terminal of each component soldered to the circuit substrate 3 does not contact the installation side wall 26. As shown in FIGS. 2 and 3, the installation side wall 26 has a protrusion portion 26a located at an edge of an inner wall surface of the installation side wall 26 adjacent to the opening side 21. When the housing 5 is fitted into the casing 2, the protrusion portion 26a is engaged with the housing 5 and prevents the housing 5 from dropping out of the casing 2.

The circuit substrate 3 has a printed pattern of the relay circuit. The circuit substrate 3 is configured by a printed substrate, for example. The width of the circuit substrate 3 is smaller than a width of the opening of the casing 2 in the direction perpendicular to the insertion direction of the circuit substrate 3 into the casing 2. Accordingly, a predetermined space is provided between the circuit substrate 3 and an inner wall surface of the casing 2. The thickness of the circuit substrate 3 is smaller than the distance between the first rail 24b and the second rail 24c of the rail portion 24a. The thickness of the circuit substrate 3 is smaller than the distance between the first rail 25b and the second rail 25c of the rail portion 25a.

As shown in FIG. 3, multiple via holes 31 and 32 are formed in the circuit substrate 3. Ends of connector terminals 41 and 42 are inserted into the via holes 31 and 32 and are electrically connected by soldering. As shown in FIG. 3, various electronic components 33 and 34 of the relay circuit, such as a microcomputer (or IC) and an electrolytic capacitor, are mounted on the circuit substrate 3 and electrically connected to a wiring (wiring pattern) formed on the circuit substrate 3 by soldering.

Moreover, multiple through holes 35a, 35b and 35c are formed in the circuit substrate 3. Ends of boss portions 46a, 46b and 46c of the resin plate 4 are fitted into the through holes 35a, 35b and 35c. Accordingly, a position of the resin plate 4 on the circuit substrate 3 is fixed.

The resin plate 4 includes the connector terminals 41 and 42, a plate portion 43 to which the connector terminal 41 is connected, and a projection portion 44 to which the connector terminal 42 is connected. The resin plate 4 supports the multiple connector terminals 41 and 42. A resin part of the resin plate 4 is made of a heat-resistant resin. The resin plate 4 extends from a surface of the circuit substrate 3 in a normal direction with respect to the surface of the circuit substrate 3. The resin plate 4 is formed by press-fitting the connector terminals 41 and 42 into multiple through holes of the resin plate 4 or by insert-molding the connector terminals 41 and 42. The plate portion 43 of the resin plate 4, on which the connector terminal 41 is disposed, has a rectangular shape. The projection portion 44 of the resin plate 4, on which the connector terminal 42 is disposed, is projected from the plate portion 43 toward the housing 5.

The plate portion 43 has a raised part 43a around the connector terminal 41 and has a shape fitting to a first through portion 51 of the housing 5. The projection portion 44 has a raised part 44a around the connector terminal 42 and has a shape fitting to a second through portion 52 of the housing 5.

Figure 5:
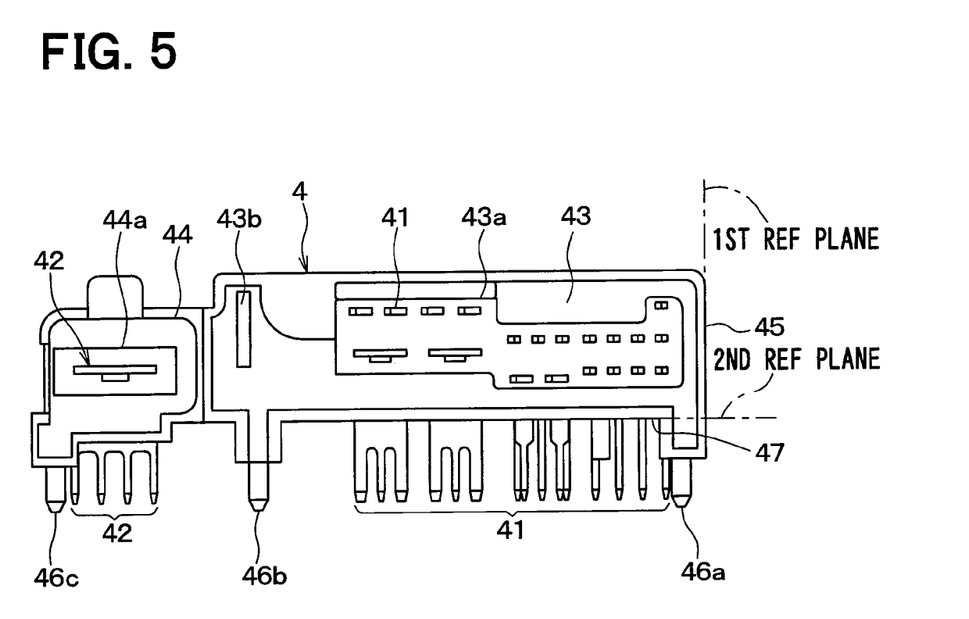
FIG. 5 is a front view showing a resin plate of the relay module device according to the embodiment.

The positions of the connector terminals 41 and 42 and the positions of the raised parts 43a and 44a on the resin plate 4 in a right-left direction on FIG. 5 are defined based on a first reference plane 45 that is a side plane of the plate portion 43 perpendicular to the circuit substrate 3 and opposite from the projection portion 44. Therefore, on the basis of the distance from the first reference plane 45, the positions of the connector terminals 41 and 42 and the positions of the raised parts 43a and 44a are defined. Accordingly, a positional accuracy is secured such that errors of these positions are smaller than or equal to a manufacturing error.

The resin plate 4 is supported by the circuit substrate 3 such that a surface direction of the plate portion 43 is aligned with the normal direction of the circuit substrate 3. The boss portions 46a, 46b and 46c, each of which includes a protrusion part protruding toward the circuit substrate 3, are formed on an end surface of the resin plate 4 adjacent to the circuit substrate 3. The ends of the boss portions 46a, 46b and 46c are fitted into the through holes 35a, 35b and 35c of the circuit substrate 3. Thus, the resin plate 4 is supported by the circuit substrate 3 and fixed in position on the circuit substrate 3.

The connector terminals 41 and 42 of the resin plate 4 extend through the plate portion 43 or the projection portion 44 toward the opposite side from the housing 5. The protruding parts of the connector terminals 41 and 42 opposite the housing 5 extend in a normal direction of the plate portion 43 and are bent at a right angle, and ends of the protruding parts of the connector terminals 41 and 42 are directed toward the circuit substrate 3. The ends of the connector terminals 41 and 42 are inserted into the multiple via holes 31 and 32 of the circuit substrate 3 and electrically connected by soldering.

The plate portion 43 of the resin plate 4 includes a guide hole 43b extending through the plate portion 43 at a position other than an area of the raised part 43a in which the connector terminal 41 is disposed. A guide 55c of the housing 5 is fitted into the guide hole 43b. The guide 55c contacts a side of the guide hole 43b adjacent to the first reference plane 45 (i.e. adjacent to the first through portion 51 of the housing 5). In other words, the guide 55c contacts a side of the guide hole 43b opposite from the projection portion 44. Consequently, the resin plate 4 is fixed such that the first reference plane 45 of the resin plate 4 and a first reference plane 56 of the housing 5 become approximately coplanar with each other.

The positions of the connector terminals 41 and 42 and the positions of the raised parts 43a and 44a on the resin plate 4 in an up-down direction on FIG. 5 are defined based on a second reference plane 47 that is a side plane of the plate portion 43 facing to the circuit substrate 3. Therefore, on the basis of the distance from the second reference plane 47, the positions of the connector terminals 41 and 42 and the positions of the raised parts 43*a* and 44*a* are defined. Accordingly, a positional accuracy is secured such that errors of these positions are smaller than or equal to a manufacturing error. The second reference plane 47 is coplanar with a second reference plane 57 of the housing 5.

The housing 5 is attached to the resin plate 4 after the connector terminals 41 and 42 of the resin plate 4 are connected to the circuit substrate 3. The housing 5 is fitted into the opening part 2*a* of the casing 2 after the circuit substrate 3 and the resin plate 4 are inserted into the opening part 2*a* of the casing 2. Accordingly, the housing 5 functions as a cover to close the opening side 21 of the casing 2. When the housing 5 is fitted into the casing 2, an end surface of the housing 5 on which the first through portion 51 is formed presses the resin plate 4 against the step portion 23*a* and the ends of the first rails 24*b* and 25*b*. Hence, the resin plate 4 is held between the housing 5 and the step portion 23*a* and between the housing 5 and the ends of the first rails 24*b* and 25*b*.

Figure 7:
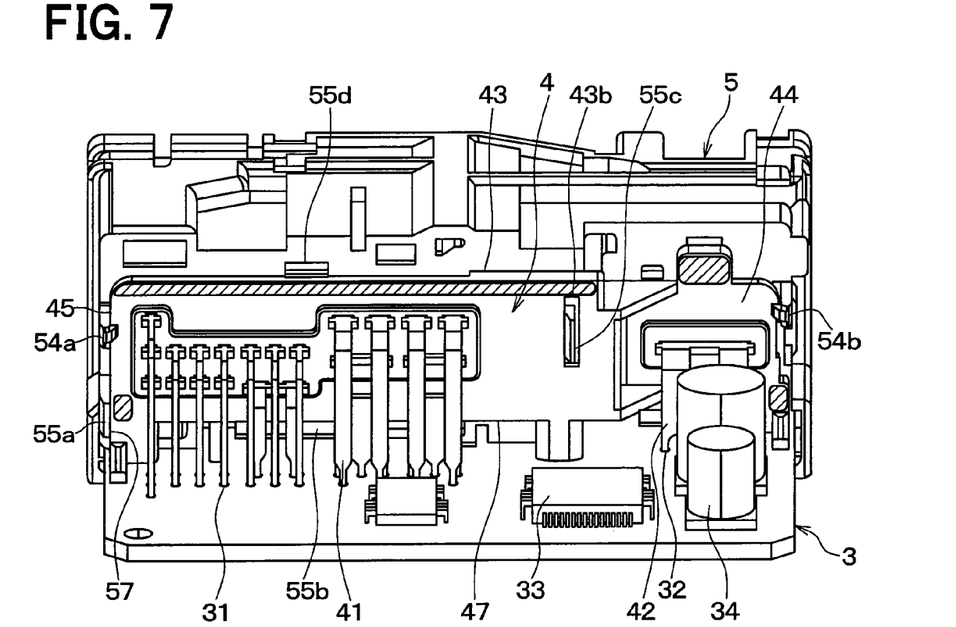
FIG. 7 is a perspective view showing a part of the relay module device after assembling, according to the embodiment.

FIG. 7 shows a state where the housing 5 is fixed to the resin plate 4 after the connector terminals 41 and 42 of the resin plate 4 are connected to the circuit substrate 3. Hatched areas shown in FIG. 7 on the resin plate 4 are in contact with the step portion 23*a* and the first rails 24*b* and 25*b* when the resin plate 4 is pressed by the housing 5 against the casing 2.

Figure 4:
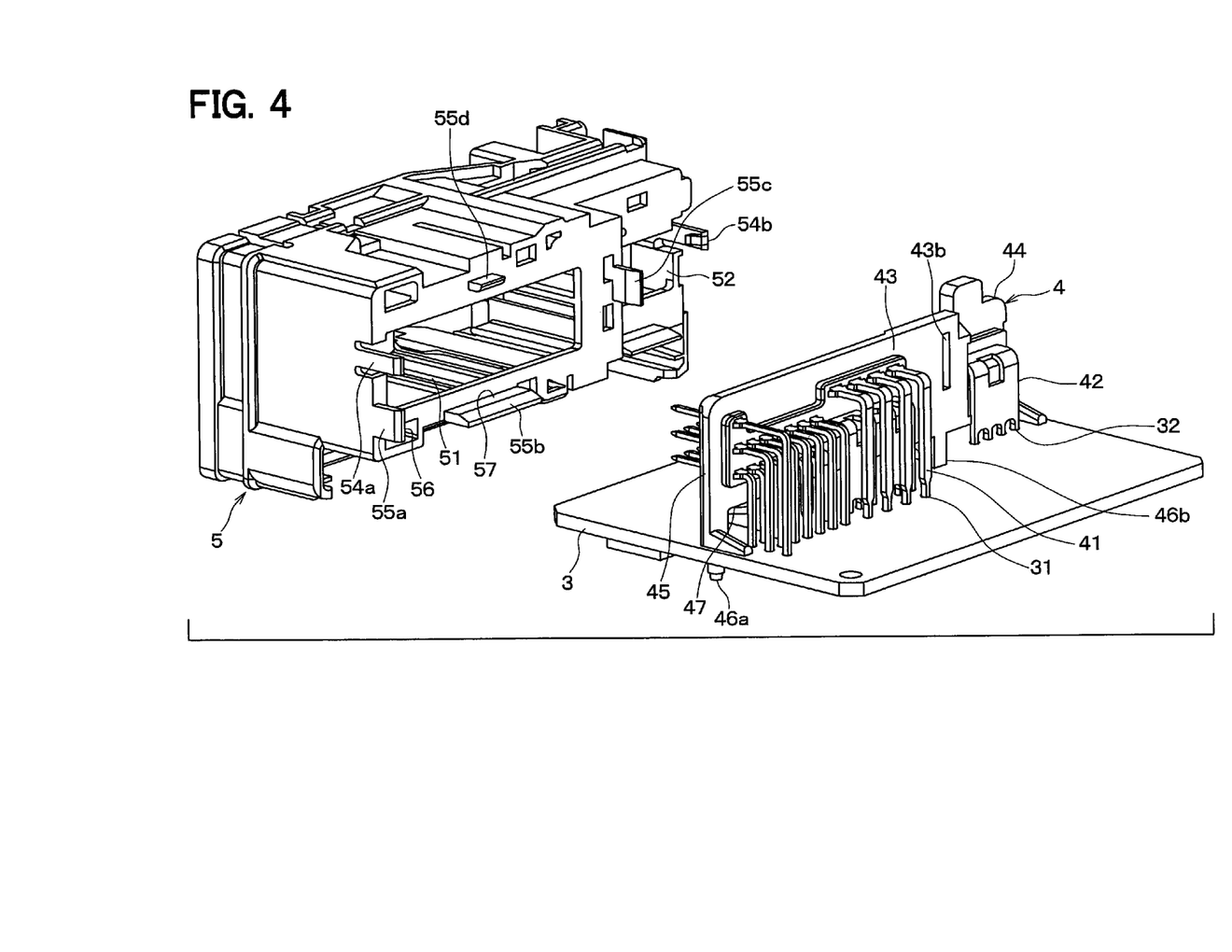
FIG. 4 is a perspective view showing a part of the relay module device during assembling, according to the embodiment.

As shown in FIG. 4, the housing 5 includes the first and second through portions 51 and 52. The ends of the connector terminals 41 and 42 protruding from the resin plate 4 are inserted into the first and second through portions 51 and 52. In the present embodiment, the first and second through portions 51 and 52 are bored therethrough to have rectangular openings. The raised parts 43*a* and 44*a* adjacent to the connector terminals 41 and 42 of the resin plate 4 have protruding shapes corresponding to the opening shapes of the first and second through portions 51 and 52. The raised parts 43*a* and 44*a* are fitted into the first and second through portions 51 and 52, respectively.

As shown in FIGS. 1 to 3, a side of the housing 5 opposite from the resin plate 4 includes an opening part 53 having an opening. As shown in FIG. 2, the connector terminals 41 and 42 inserted into the first and second through portions 51 and 52 are exposed to outside through the opening part 53. When an external connector portion is inserted into the opening part 53 and connected to the housing 5 as an internal connector portion, an electric connection to the connector terminals 41 and 42 is achieved.

Figure 6A:
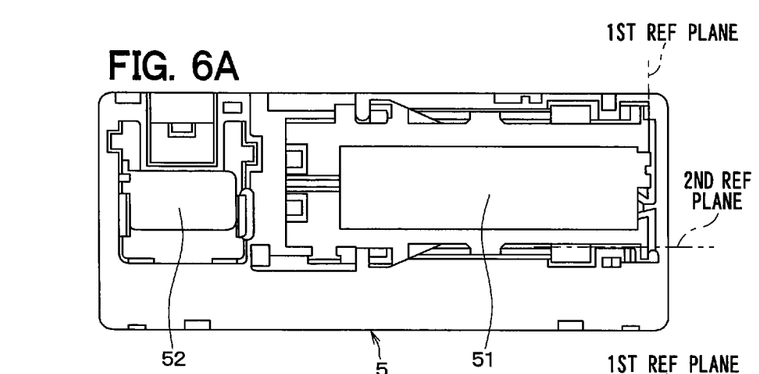
FIG. 6A is a front view showing a housing of the relay module device according to the embodiment.
Figure 6B:
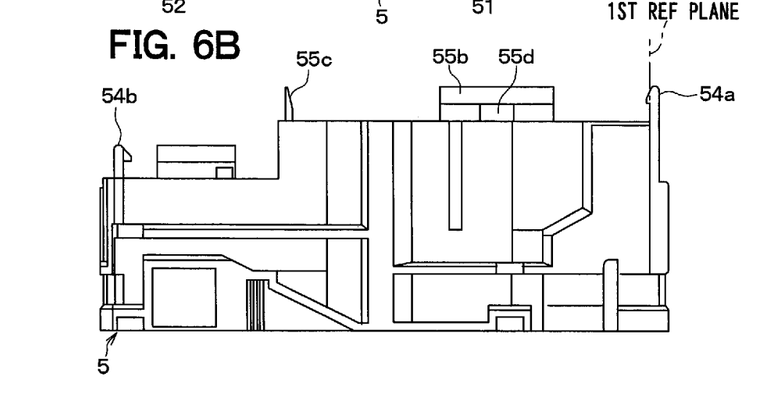
FIG. 6B is a top view showing the housing according to the embodiment.
Figure 6C:
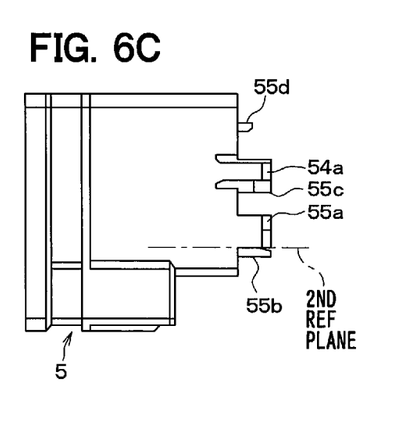
FIG. 6C is a side view showing the housing according to the embodiment.

As shown in FIGS. 4 and 6, the housing 5 includes a hook 54*a* extending toward the resin plate 4 at a position adjacent to the first through portion 51 of the housing 5 and on an opposite side of the first through portion 51 from the second through portion 52. An end of the hook 54*a* has a claw protruding toward an inner side of the first through portion 51. The claw is engaged with the resin plate 4. Similarly, the housing 5 includes a hook 54*b* extending toward the resin plate 4 at a position adjacent to the second through portion 52 of the housing 5 and on an opposite side of the second through portion 52 from the first through portion 51. An end of the hook 54*b* has a claw protruding toward an inner side of the second through portion 52. The claw is engaged with the resin plate 4.

The housing 5 includes four guides (first to fourth guides) 55*a*, 55*b*, 55*c* and 55*d* which extend toward the resin plate 4, respectively, on four sides of the first through portion 51 having the rectangular shape. The guides 55*a*, 55*b*, 55*c* and 55*d* each have a flat plate shape extending parallel to each side of the first through portion 51.

The first guide 55*a* positioned on an opposite side of the first through portion 51 from the second through portion 52 defines the first reference plane 56 of the housing 5. The first guide 55*a* has a flat surface on a side toward the first through portion 51, and the flat surface of the first guide 55*a* defines the first reference plane 56. The third guide 55*c* positioned on a side of the first through portion 51 adjacent to the second through portion 52 (i.e. an opposite side of the first through portion 51 from the first guide 55*a*) is fitted into the guide hole 43*b* of the resin plate 4. The third guide 55*c* contacts a side of the guide hole 43*b* adjacent to the first through portion 51, thereby pressing the resin plate 4 toward the other guide 55*a*. Accordingly, the first reference plane 56 of the housing 5 and the first reference plane 45 of the resin plate 4 are coplanar with each other.

The second guide 55*b* positioned on a side of the first through portion 51 facing to the circuit substrate 3 defines the second reference plane 57 of the housing 5. The second guide 55*b* has a flat surface on a side toward the first through portion 51, and the flat surface of the second guide 55*b* defines the second reference plane 57. The fourth guide 55*d* positioned on an opposite side of the first through portion 51 from the circuit substrate 3 contacts an end surface of the plate portion 43 of the resin plate 4 on an opposite side of the plate portion 43 from the circuit substrate 3. Thus, the fourth guide 55*d* presses the resin plate 4 toward the other guide 55*b* (i.e. toward the first through portion 51 of the housing 5). Accordingly, the second reference plane 57 of the housing 5 and the second reference plane 47 of the resin plate 4 are coplanar with each other.

The relay module device 1 according to the first embodiment has the above-described configurations. Such relay module device 1 is manufactured as below.

First, the circuit substrate 3 having the wiring is prepared, and the resin plate 4 including the multiple connector terminals 41 and 42 and the electronic components 33 and 34 are prepared. Next, a solder cream is applied to both side surfaces of the circuit substrate 3 so as to be applied to the multiple via holes 31 and 32 formed in the circuit substrate 3 and positions on which the electronic components 33 and 34 are mounted. The electronic components 33 and 34 are mounted on the applied solder cream, and the position of the resin plate 4 is fixed by insertion of the end of the boss portions 46*a*, 46*b* and 46*c* into the through holes 35*a*, 35*b* and 35*c*. Subsequently, the ends of the connector terminals 41 and 42 are inserted into the multiple via holes 31 and 32.

While this state is maintained, the circuit substrate 3 and the resin plate 4 are transferred into a reflow mounting device (reflow furnace). The solder cream is melted in the reflow process, and soldering of each component is performed. Since the housing 5 is not attached to the circuit substrate 3 and the resin plate 4, i.e. since at least only the circuit substrate 3 and the resin plate 4 can be transferred into the reflow mounting device, transfer without a component larger than the width of the circuit substrate 3 becomes possible. Therefore, it is not necessary to provide a transfer space, so-called "ear", surrounding the circuit substrate 3.

Figure 8:
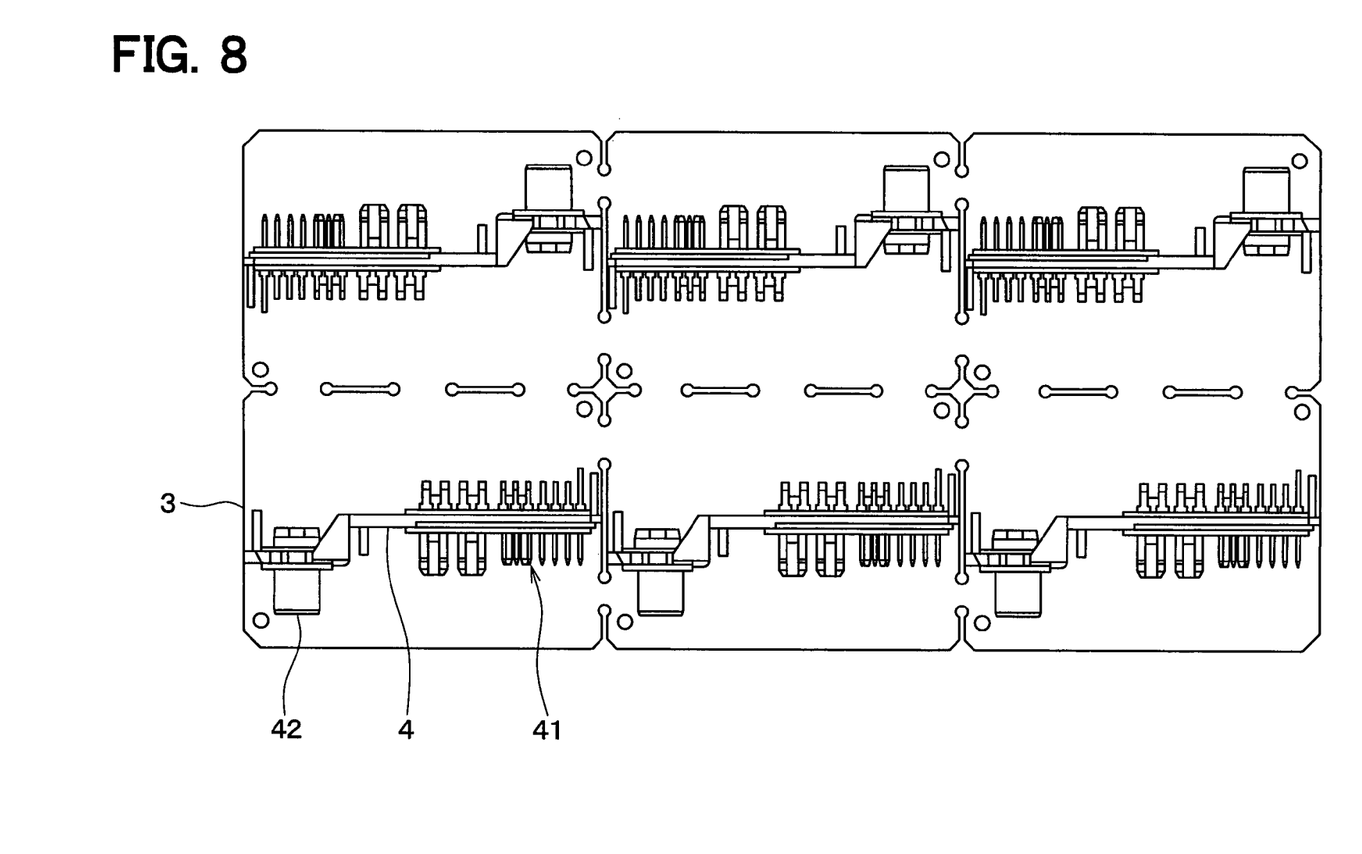
FIG. 8 is a view showing a multiple-set substrate having multiple circuit substrates integrated with each other, according to the embodiment.

For example, as shown in FIG. 8, when a multiple set substrate in which multiple circuit substrates 3 are integrated is transferred into the reflow mounting device, each circuit substrate 3 is attached to the resin plate 4. Also in this case, it is enough to just attach the resin plate 4 directly to each circuit substrate 3, and it is unnecessary to provide a transfer space around them additionally.

Since the housing 5 is not integrated to the circuit substrate 3 or the resin plate 4 in the reflow process, the housing 5 is not subjected to high temperature. Thus, while the resin plate 4 is required to be made of heat-resistant resin, the housing 5 is not required to be made of heat-resistant resin. Therefore, a degree of freedom of material selection for the housing 5 can be improved, and a cost can be reduced.

When the resin plate 4 and the circuit substrate 3 are assembled in a state where the housing 5 is integrated with the resin plate 4 and the circuit substrate 3, the resin plate 4 may be fallen down in a direction along which ends of the connector terminals 41 and 42 are removed out of the via holes 31 and 32 due to a weight of the housing 5. However, when the housing 5 is not integrated with the resin plate 4 and the circuit substrate 3, a side of the resin plate 4 from which a large fraction of the connector terminals 41 and 42 protrude (i.e. a side of the resin plate 4 toward the via holes 31 and 32) is heavier than the opposite side of the resin plate 4. Therefore, own weight of the resin plate 4 acts on the ends of the connecter terminals 41 and 42 to penetrate into the via holes 31 and 32. Accordingly, soldering can be performed more accurately.

After completion of the soldering, the circuit substrate 3 and the resin plate 4 are removed from the reflow mounting device, and the housing 5 is fixed to the resin plate 4. More specifically, the connector terminal 41 and the raised part 43a are fitted into the first through portion 51, and the connector terminal 42 and the raised part 44a are fitted into the second through portion 52. The third guide 55c is fitted into the guide hole 43b while the other guides 55a, 55b and 55d contacts each side of the plate portion 43. The claws of the hooks 54a and 54b are engaged with the resin plate 4.

Accordingly, the first reference plane 56 of the housing 5 and the first reference plane 45 of the resin plate 4 become coplanar with each other while the second reference plane 57 of the housing 5 and the second reference plane 47 of the resin plate 4 become coplanar with each other. The housing 5 is fixed to the resin plate 4, and therefore the circuit substrate 3, the resin plate 4 and the housing 5 are integrated.

In this case, the first reference plane 56 of the housing 5 and the first reference plane 45 of the resin plate 4 are coplanar with each other. Further, the second reference plane 57 of the housing 5 and the second reference plane 47 of the resin plate 4 become coplanar with each other. Hence, each component of the resin plate 4 and each component of the housing 5 are positioned with reference to the same reference planes. Even when both the resin plate 4 and the housing 5 have a manufacturing error in dimension, both the manufacturing errors are measured from the same reference planes. Therefore, double errors can be avoided, and the error can be reduced.

Subsequently, the circuit substrate 3 and the resin plate 4 are inserted into the casing 2 through the opening side 21, and the opening side 21 of the casing 2 is closed by the housing 5 as a cover. During the insertion of the circuit substrate 3, the circuit substrate 3 is inserted between the first rails 24b and the second rails 24c and between the first rails 25b and the second rails 25c. Accordingly, the circuit substrate 3 is disposed at a desired position within the casing 2.

The resin plate 4 is held by the housing 5 and the casing 2, and the circuit substrate 3 is supported via the resin plate 4 with being spaced from the housing 5 and the casing 2. More specifically, as shown in FIG. 2, the resin plate 4 is sandwiched between the hosing 5 and the step portion 23a of the casing 2 and between the housing 5 and the ends of the first rails 24b and 25b. While the resin plate 4 is held by the casing 2 and the housing 5, the circuit substrate 3 is supported by the resin plate 4 with being spaced from the housing 5 and the casing 2.

Even when a stress acts on the connector terminals 41 and 42 due to insertion or pulling out of an external connector portion into or from the opening part 53 of the housing 5, a stress acting on a soldered part between the connector terminals 41 and 42 and the circuit substrate 3 can be reduced.

Figure 9:
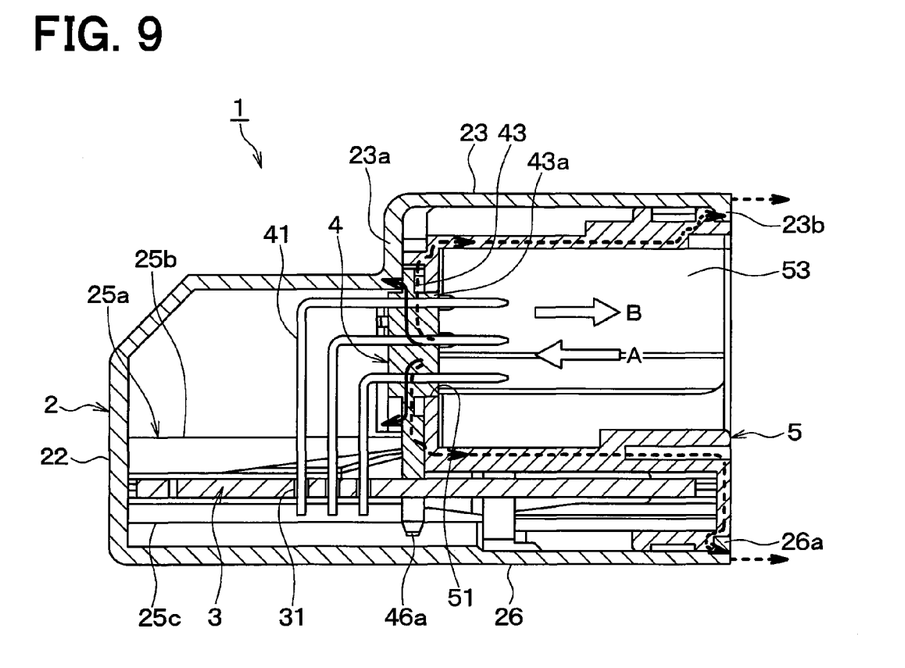
FIG. 9 is a sectional view showing a transfer pathway of stress generated in the relay module device when a connector portion is inserted into or pulled out from an opening part of the housing 5, according to the embodiment.

For example, as shown in FIG. 9, when the connector portion is inserted into the opening part 53 of the housing 5, the housing 5 is pressed in a direction represented by an arrow A in FIG. 9. A stress is acted on the resin plate 4 along a transfer pathway as shown by solid arrows in FIG. 9. In this case, the stress is transferred from the resin plate 4 to the step portion 23a and the end of the first rail 24b (25b) of the casing 2. However, little stress is transferred to soldered parts between the connector terminal 41 and the circuit substrate 3 and between the connector terminal 42 and the circuit substrate 3.

As shown in FIG. 9, when the connector portion is pulled out from the opening part 53 of the housing 5, the housing 5 is pulled in a direction represented by an arrow B in FIG. 9. A stress acted on the resin plate 4 along a transfer pathway as shown by dashed arrows in FIG. 9. In this case, the stress is transferred from the resin plate 4 to the housing 5 and further to the end portion (23b and 26a) on the opening side 21 of the casing 2. However, little stress is transferred to the soldered parts between the connector terminal 41 and the circuit substrate 3 and between the connector terminal 42 and the circuit substrate 3.

Moreover, the resin plate 4 is separated from the housing 5. Thus, at least only the resin plate 4 and the circuit substrate 3 need to be soldered in the reflow process, and the housing 5 is not need to be subjected to high temperature.

Therefore, according to the relay module device 1 of the present embodiment, the stress acting on the soldered parts between the connector terminal 41 and the circuit substrate 3 and between the connector terminal 42 and the circuit substrate 3 can be reduced, even without exposure of the housing 5 to high temperature or screwing of the circuit substrate 3 to the housing 5.

The resin plate 4 may extend in the normal direction with respect to the surface of the circuit substrate 3. The casing 2 may include the bottom side wall 22 opposite from the opening side 21, and four side walls 23, 24, 25 and 26 may extend from the bottom side wall 22 to the opening side 21. The four side walls 23, 24, 25 and 26 may include the stepped side wall 23 facing to the surface of the circuit substrate 3 on which the resin plate 4 is mounted. The stepped side wall 23 may include the step portion 23a contacting the resin plate 4. The resin plate 4 may be held between the housing 5 and the step portion 23a of the casing 2.

Accordingly, for example, a structure where the resin plate 4 is held by the step portion 23a formed on the stepped side wall 23 and the housing 5 can be provided.

The four side walls 23, 24, 25 and 26 may include the two rail side walls 24 and 25 which are positioned adjacent, respectively, to both sides of the stepped side wall 23. Each rail side wall 24, 25 may include the rail portion 24a, 25a having the first rail 24b, 25b and the second rail 24c, 25c which protrude from an inner wall surface of the rail side wall 24, 25 to the opening part 2a of the casing 2. The first rail 24b, 25b and the second rail 24c, 25c may be separated from each other and extend in an insertion direction of the circuit substrate 3 into the casing 2. The circuit substrate 3 may be positioned between the first rail 24b, 25b and the second rail 24c, 25c while the circuit substrate 3 may be separated by a predetermined space from the first rail 24b, 25b and the second rail 24c, 25c.

Accordingly, the stress acting on the soldered parts between the connector terminal 41 and the circuit substrate 3 and between the connector terminal 42 and the circuit substrate 3 can be further reduced.

The end of the first rail 24b, 25b of each rail side wall 24, 25 may contact the resin plate 4. The resin plate 4 may be held between the housing 5 and the end of the first rail 24b, 25b.

Accordingly, the resin plate 4 can be held by the end of the first rail 24b, 25b and the housing 5.

The resin plate 4 may extend in the normal direction with respect to the surface of the circuit substrate 3. The resin plate 4 may include a plate portion 43 having the rectangular shape. The plate portion 43 may include the first reference plane 45 on the lateral surface perpendicular to the circuit substrate 3, and the second reference plane 47 on the surface facing to the circuit substrate 3. The housing 5 may include the through portion 51 into which the connector terminal 41 of the resin plate 4 is inserted. The housing 5 may include the first and second guides 55a, 55b positioned adjacent to the through portion 51 and protruding toward the resin plate 4. The first guide 55a may have the first reference plane 56 contacting the first reference plane 45 of the resin plate 4. The second guide 55b may have the second reference plane 57 contacting the second reference plane 47 of the resin plate 4.

Accordingly, the positions of each element can be fixed on the basis of the first reference planes 45 and 56 coplanar with each other, and the positions of each element can be fixed on the basis of the second reference planes 47 and 57 coplanar with each other. Therefore, each element of the resin plate 4 and each element of the housing 5 can be positioned based on the first reference planes 45 and 56 and the second reference planes 47 and 57. Hence, the dimensional errors can be made to be smaller than or equal to a manufacturing error.

The housing 5 may include the third guide 55c that is positioned on an opposite side of the through portion 51 from the first guide 55a and protrudes toward the resin plate 4. The resin plate 4 may include the guide hole 43b at a position corresponding to the third guide 55c. The side of the third guide 55c that is positioned adjacent to the through portion 51 may contact a surface of the resin plate 4 that defines the guide hole 43b such that the first reference plane 45 of the resin plate 4 is pressed against the first reference plane 56 of the housing 5.

Accordingly, the first reference plane 56 of the housing 5 and the first reference plane 45 of the resin plate 4 can be certainly made to be coplanar with each other.

The housing 5 may include the fourth guide 55d that is positioned on an opposite side of the through portion 51 from the second guide 55b and protrudes toward the resin plate 4. The side of the fourth guide 55d that is positioned adjacent to the through portion 51 may contact the resin plate 4 such that the second reference plane 47 of the resin plate 4 is pressed against the second reference plane 57 of the housing 5.

Accordingly, the second reference plane 57 of the housing 5 and the second reference plane 47 of the resin plate 4 can be certainly made to be coplanar with each other.

Although the present disclosure has been fully described in connection with the preferred embodiment thereof with reference to the accompanying drawings, the present disclosure is not limited to the above-described embodiment. It is to be noted that various changes and modifications described below will become apparent to those skilled in the art.

For example, the relay module device 1 is described as an example of the electric connection box, but the present disclosure can be applied to an electric connection box provided with an electronic control unit (ECU).

In the above-described embodiment, the components of the embodiment are not necessarily essential except for a case where the components are explicitly described as essential components or essential in principle. In the above-described embodiment, when a numerical value, such as the number, value, amount or range, of a component is mentioned, the component is not limited to the specific value except for a case where the numerical value is explicitly described as an essential value or clearly limited to the specific value in principle. In the above-described embodiment, when shapes or a positional relationship of components are mentioned, the components are not limited to the shapes or the positional relationship except for a case where the shapes or the positional relationship is explicitly described essential or clearly limited to the specific shapes or the specific positional relationship in principle.

Additional advantages and modifications will readily occur to those skilled in the art. The disclosure in its broader terms is therefore not limited to the specific details, representative apparatus, and illustrative examples shown and described.

What is claimed is:

1. An electric connection box comprising:
   a circuit substrate including a wiring and a via hole connected to the wiring;
   a resin plate including a connector terminal soldered to the via hole, the resin plate being integrated with the circuit substrate;
   a casing including an opening part having an opening side through which the circuit substrate and the resin plate are inserted to be housed in the opening part; and
   a housing positioned in the opening part and functioning as a cover closing the opening side of the casing, the resin plate being interposed between and held by the housing and the casing, wherein
   the circuit substrate is supported by the housing and the casing through the resin plate held between the housing and the casing while the circuit substrate is spaced from the housing and the casing;
   the casing includes a bottom side wall opposite from the opening side,
   the circuit substrate includes an edge surface that faces to the bottom side wall of the casing without contacting the bottom side wall, and a pair of opposed surfaces spreading approximately perpendicular to the resin plate without contacting the casing or the housing.

2. The electric connection box according to claim 1, wherein
   the resin plate extends in a normal direction with respect to a surface of the circuit substrate,
   the casing includes a bottom side wall opposite from the opening side, and four side walls extending from the bottom side wall to the opening side,
   the four side walls include a stepped side wall facing to the surface of the circuit substrate on which the resin plate is mounted,
   the stepped side wall includes a step portion contacting the resin plate, and the resin plate is held between the housing and the step portion of the casing.

3. The electric connection box according to claim 2, wherein the four side walls include two rail side walls which are positioned adjacent, respectively, to both sides of the stepped side wall, each rail side wall includes a rail portion having a first rail and a second rail which protrude from an inner wall surface of the rail side wall to the opening part of the casing, the first rail and the second rail are separated from each other and extend in an insertion direction of the circuit substrate into the casing, the circuit substrate is positioned between the first rail and the second rail while the circuit substrate is separated by a predetermined space from the first rail and the second rail; and one of the first and second rails of each rail side wall has an edge surface facing to the opening side of the casing and being in contact with the resin plate.

4. The electric connection box according to claim 3, wherein an end of the first rail of each rail side wall contacts the resin plate, and the resin plate is held between the housing and the end of the first rail.

5. The electric connection box according to claim 1, wherein the resin plate extends in a normal direction with respect to a surface of the circuit substrate, the resin plate includes a plate portion having a rectangular shape, the plate portion includes a first reference plane on a lateral surface perpendicular to the circuit substrate, and a second reference plane on a surface facing to the circuit substrate, the housing includes a through portion into which the connector terminal of the resin plate is inserted, the housing includes first and second guides positioned adjacent to the through portion and protruding toward the resin plate, the first guide has a first reference plane contacting the first reference plane of the resin plate, and the second guide has a second reference plane contacting the second reference plane of the resin plate.

6. The electric connection box according to claim 5, wherein the housing includes a third guide that is positioned on an opposite side of the through portion from the first guide and protrudes toward the resin plate, the resin plate includes a guide hole at a position corresponding to the third guide, and a side of the third guide that is positioned adjacent to the through portion contacts a surface of the resin plate that defines the guide hole such that the first reference plane of the resin plate is pressed against the first reference plane of the housing.

7. The electric connection box according to claim 5, wherein the housing includes a fourth guide that is positioned on an opposite side of the through portion from the second guide and protrudes toward the resin plate, and a side of the fourth guide that is positioned adjacent to the through portion contacts the resin plate such that the second reference plane of the resin plate is pressed against the second reference plane of the housing.

8. An electric connection box comprising:

a circuit substrate including a wiring and a via hole connected to the wiring;

a resin plate including a connector terminal soldered to the via hole, the resin plate being integrated with the circuit substrate;

a casing including an opening part having an opening side through which the circuit substrate and the resin plate are inserted to be housed in the opening part; and a housing positioned in the opening part and functioning as a cover closing the opening side of the casing, the resin plate being interposed between and held by the housing and the casing, wherein the circuit substrate is supported by the housing and the casing through the resin plate held between the housing and the casing while the circuit substrate is spaced from the housing and the casing;

the resin plate extends in a normal direction with respect to a surface of the circuit substrate, the resin plate includes a plate portion having a rectangular shape, the plate portion includes a first reference plane on a lateral surface perpendicular to the circuit substrate, and a second reference plane on a surface facing to the circuit substrate, the housing includes a through portion into which the connector terminal of the resin plate is inserted, the housing includes first and second guides positioned adjacent to the through portion and protruding toward the resin plate, the first guide has a first reference plane contacting the first reference plane of the resin plate, and the second guide has a second reference plane contacting the second reference plane of the resin plate.

9. The electric connection box according to claim 8, wherein the housing includes a third guide that is positioned on an opposite side of the through portion from the first guide and protrudes toward the resin plate, the resin plate includes a guide hole at a position corresponding to the third guide, and a side of the third guide that is positioned adjacent to the through portion contacts a surface of the resin plate that defines the guide hole such that the first reference plane of the resin plate is pressed against the first reference plane of the housing.

10. The electric connection box according to claim 8, wherein the housing includes a fourth guide that is positioned on an opposite side of the through portion from the second guide and protrudes toward the resin plate, and a side of the fourth guide that is positioned adjacent to the through portion contacts the resin plate such that the second reference plane of the resin plate is pressed against the second reference plane of the housing.

\* \* \* \* \*